United States Patent [19]
Sato

[11] Patent Number: 5,867,427
[45] Date of Patent: Feb. 2, 1999

[54] ELECTRICALLY WRITABLE NONVOLATILE SEMICONDUCTOR MEMORY DEVICE

[75] Inventor: Toshiya Sato, Tokyo, Japan

[73] Assignee: NEC Corporation, Tokyo, Japan

[21] Appl. No.: 908,673

[22] Filed: Aug. 7, 1997

[30] Foreign Application Priority Data

Aug. 7, 1996 [JP] Japan .................................. 8-208583

[51] Int. Cl.⁶ .............................. G11C 11/34; G11C 7/00
[52] U.S. Cl. .................. 365/185.2; 365/185.21; 365/185.24; 365/185.33; 365/189.07
[58] Field of Search ........................ 365/185.2, 185.21, 365/185.23, 185.24, 185.33, 207, 208, 189.07

[56] References Cited

U.S. PATENT DOCUMENTS

| | | | |
|---|---|---|---|
| 5,272,674 | 12/1993 | Pathak et al. | 365/185.21 |
| 5,351,212 | 9/1994 | Hashimoto | 365/185.21 |
| 5,566,111 | 10/1996 | Choi | 365/185.21 |

FOREIGN PATENT DOCUMENTS

| | | |
|---|---|---|
| 62-185298 | 8/1987 | Japan . |
| 1-42080 | 9/1989 | Japan . |
| 5-151787 | 6/1993 | Japan . |

*Primary Examiner*—David Nelms
*Assistant Examiner*—Trong Phan
*Attorney, Agent, or Firm*—Foley & Lardner

[57] ABSTRACT

An electrically writable nonvolatile semiconductor memory device capable of writing data to any desired threshold value accurately without resorting to a write confirming operation is disclosed. The memory device senses a current flowing through a memory cell transistor while effecting a writing operation. When the current reaches a preselected value, the memory device stops the writing operation. A relation between a desired threshold voltage and the current to flow through the memory cell transistor during wiring is determined beforehand. This eliminates the need for the confirmation of the threshold voltage relying on a reading operation, and allows a desired threshold voltage to be set rapidly and accurately.

7 Claims, 7 Drawing Sheets

- WRITING
- OPERATION

- WRITE
- CONFIRMING
  OPERATION

DIRECTION OF VARIATION OF
THRESHOLD VOLTAGE DUE TO
HOT ELECTRON INJECTON

ELECTRICALLY WRITABLE NONVOLATILE SEMICONDUCTOR MEMORY DEVICE

BACKGROUND OF THE INVENTION

The present invention relates to an electrically writable nonvolatile semiconductor memory device, particularly one capable of setting the threshold potential of a cell transistor assigned to a writing operation rapidly and accurately.

A flash memory is attracting increasing attention as a memory for allowing data to be rewritten and for holding data even at the time of power down. To write data in a flash memory, either a channel hot electron injection scheme or a Fowler-Nodeheim tunneling scheme is often used. These two schemes both set the threshold voltage of a cell transistor corresponding to a write address at a preselected potential, and determine data to be read on the basis of a current to flow through the transistor and derived from the above potential.

There has recently been proposed a multivalue semiconductor memory device capable of holding a number of bit data in a single cell transistor due to enhanced integration. Data is written to a multivalue semiconductor memory device in basically the same manner it is written to a flash memory. The difference is that the multivalue semiconductor memory device must have its threshold voltage set with accuracy, and therefore must repeat the write confirming operation more frequently than the flash memory.

However, with any one of the conventional electrically writable nonvolatile semiconductor memory devices, it is difficult to minimize the substantial period of time necessary for the writing operation to be completed, and to set a desired threshold with accuracy.

SUMMARY OF THE INVENTION

It is therefore an object of the present invention to provide an electrically writable nonvolatile semiconductor memory device capable of writing data to any desired threshold value accurately without resorting to a write confirmation sequence.

An electrically writable nonvolatile semiconductor memory device including a memory cell transistor of the present invention has a current feeding circuit for feeding a write current to the memory cell transistor during writing, a write current sensing circuit for producing a sense signal when the write current reaches a preselected value, and a stopping circuit for stopping a writing operation in response to the sense signal.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

To better understand the present invention, reference will be made to a conventional electrically writable nonvolatile semiconductor memory device. Today, attention is riveted to a flash memory allowing data to be rewritten and holding data even at the time of power down, and a multivalue semiconductor memory device capable of holding a number of bit data in a single cell transistor due to enhanced integration, as stated earlier.

To write data in a flash memory, either a channel hot electron injection scheme or a Fowler-Nodeheim tunneling scheme has customarily been used. These two schemes both set the threshold voltage of a cell transistor corresponding to a write address at a preselected potential, and determine data to be read out on the basis of a current to flow through the transistor and derived from the above potential.

Figure 1:
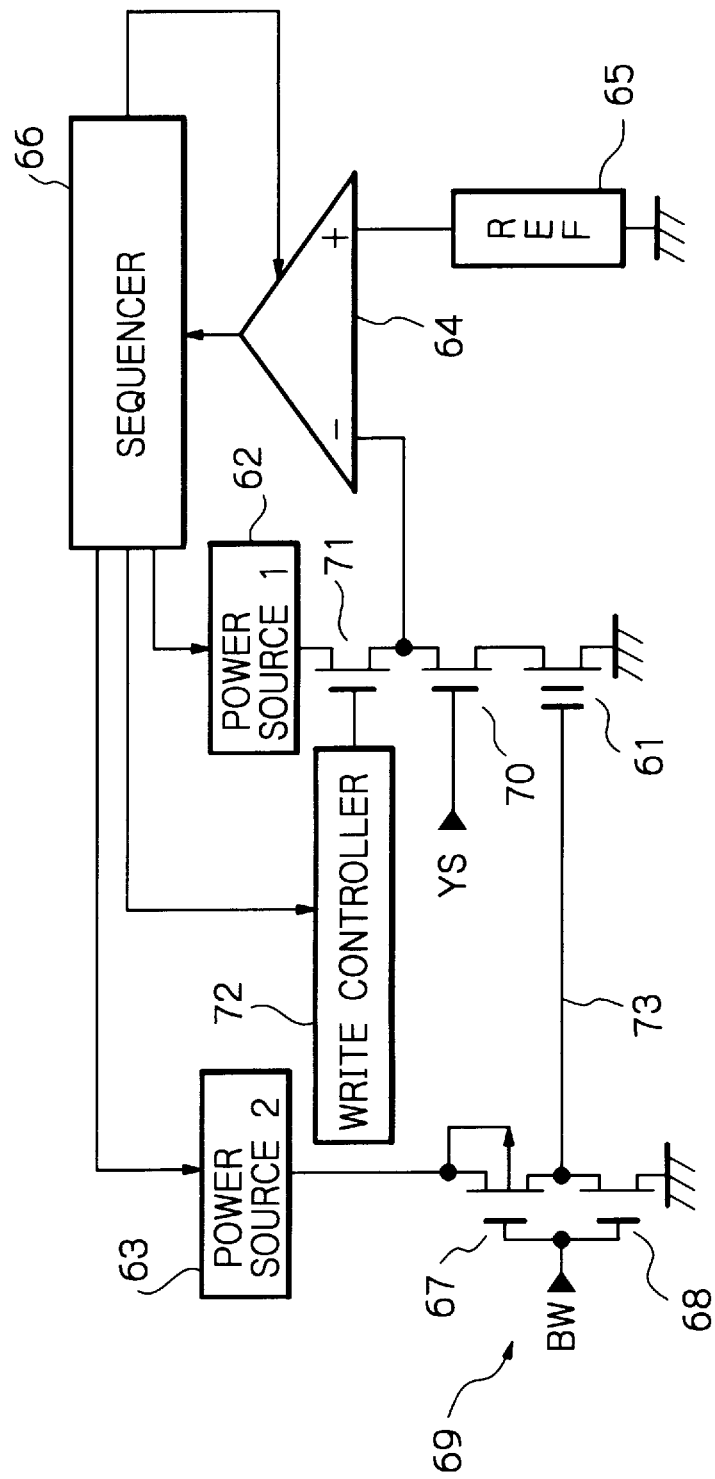
FIG. 1 is a block diagram schematically showing a conventional nonvolatile semiconductor memory device.

FIG. 1 shows specific circuitry representative of a conventional nonvolatile semiconductor memory device using the channel hot electron injection scheme. Basically, the circuitry is made up of a first power source circuit (power source 1) 62, a second power source circuit (power source 2) 63, a sense amplifier 64, a reference current source 65, a sequencer 66, a driver 69, a select transistor (n-channel MOS (Metal Oxide Semiconductor) transistor) 70, an n-channel MOS transistor 71, and a write controller 72. The first power source 62 feeds a write potential to the drain of a cell transistor 61 at the time of writing. The second power source 63 sets a particular potential of a word line in accordance with a mode. The sense amplifier 64 senses a current flowing through the cell transistor 61 and outputs data corresponding to the threshold potential of the transistor 61. The reference power source 65 sets a reference current source for the sense amplifier 64. The driver 69 has a p-channel MOS transistor 67 and an n-channel MOS transistor 68 and feeds a write potential to the gate of the cell transistor 61 at the time of writing or feeds a read potential to the same at the same time of reading. The select transistor 70 feeds a write potential to the drain of the cell transistor 61 at the same time of writing or feeds a read potential to the same at the time of reading. The n-channel MOS transistor 71 plays the role of a switching device for determining whether or not to feed the write potential to the cell transistor 61. The write controller 72 controls the operation of the transistor 71.

Figure 2:
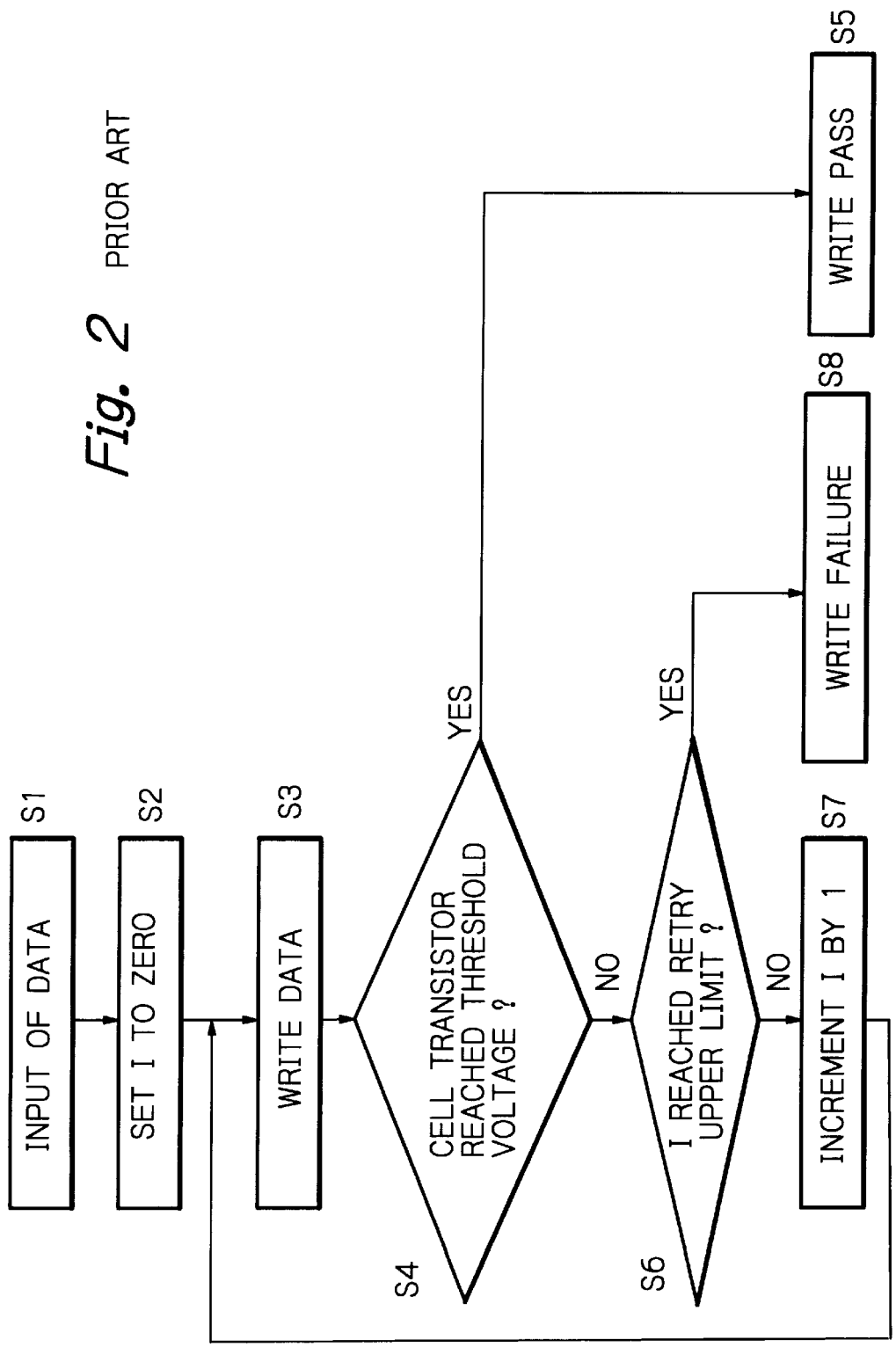
FIG. 2 is a flowchart demonstrating a specific writing routine particular to the embodiment shown in FIG. 1.

FIG. 2 demonstrates the operation of the circuitry shown in FIG. 1. A major part of the operation to be described is taught in Japanese Patent Publication No. 1-42080 as prior art. Briefly, data is written to a cell transistor selected by varying the threshold potential of the transistor. After the writing of the data, whether or not the cell transistor has reached its threshold potential is determined. If the answer of this decision is negative, the same data is again written to the cell transistor, and then the above decision is repeated. Such a procedure is repeated a preselected number of times. The writing operation fails when the preselected number of times is reached.

Specifically, as shown in FIG. 2, data to be written is input (step S1). Then, the number of times of writing to be repeated (retry counter) I is reset (step S2). Thereafter, data is written to a cell selected (step S3). At this instant, the potential output from the second power source 63 is selectively fed to a word line 73, FIG. 1, from the second power source circuit 63 as a write potential (e.g. 12V). At the same time, the write potential (e.g. 6 V) is applied to the drain of the cell transistor 61 via the transistors 71 and 70. As a result, electrons are injected into the floating gate of the cell transistor 61 by hot electron injection, raising the threshold voltage of the transistor 61.

After the writing of the data, whether or not the voltage of the cell transistor 61 has reached its preselected voltage is determined, (step S4). For this purpose, the potential to be output from the second power source 63 is set at a write confirmation potential (e.g. 7 V) and applied to the cell transistor 61. Subsequently, the transistor 71 is turned off. In this condition, the sense amplifier 64 is rendered active in order to apply the read potential to the drain of the cell transistor 61 and effect a reading operation. In the circuitry shown in FIG. 1, the writing operation causes the threshold voltage of the cell transistor to rise. Therefore, whether or not the cell transistor has reached the threshold voltage is determined on the basis of whether or not a current is flowing through the cell transistor 61 with the write confirmation potential being applied to the gate of the cell transistor.

If the answer of the step S4 is positive (YES), the writing operation is stopped (step S5). If the answer of the step S4 is negative (NO), whether or not the retry counter I has reached the preselected number of times, i.e., the upper limit (step S6) is determined. If the answer of the step S6 is NO, the retry counter I is incremented by 1 (one) in order to retry the writing operation (step S7). If the answer of the step S6 is YES, the writing operation is determined to have failed and is stopped. The above procedure is executed by the sequencer 66.

Figure 3:
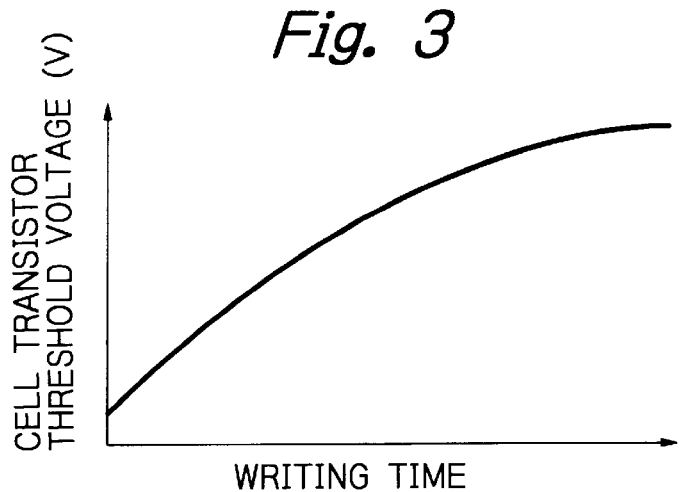
FIG. 3 is a graph showing a relation between a writing time and a threshold voltage assigned to a cell transistor.
Figure 4:
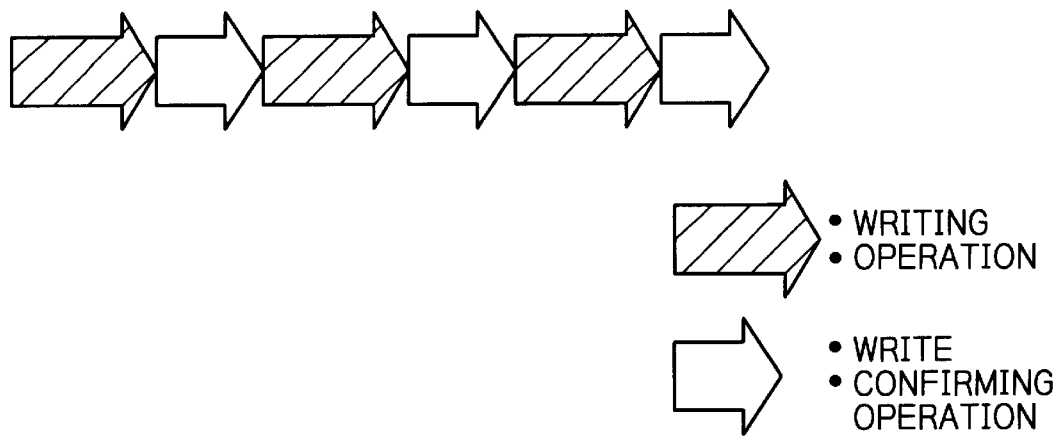
FIG. 4 shows a period of time necessary for the conventional memory device to complete a writing operation.

FIG. 3 shows a relation between the writing time and the threshold voltage of the cell transistor. FIG. 4 shows a relation between the total writing time and the writing operation and write confirming operation.

As for writing, the Fowler-Nodeheim tunneling scheme is identical with the channel hot electron injection scheme except that a potential for causing Fowler-Nodeheim tunneling to occur is applied to each contact of the cell transistor. Also, data is written to a multivalue semiconductor memory device in basically the same manner that it is written to a flash memory. The difference is that the multi-value semiconductor memory must have its threshold voltage set with accuracy, and therefore must repeat the write confirming operation more frequently than the flash memory.

Figure 5:
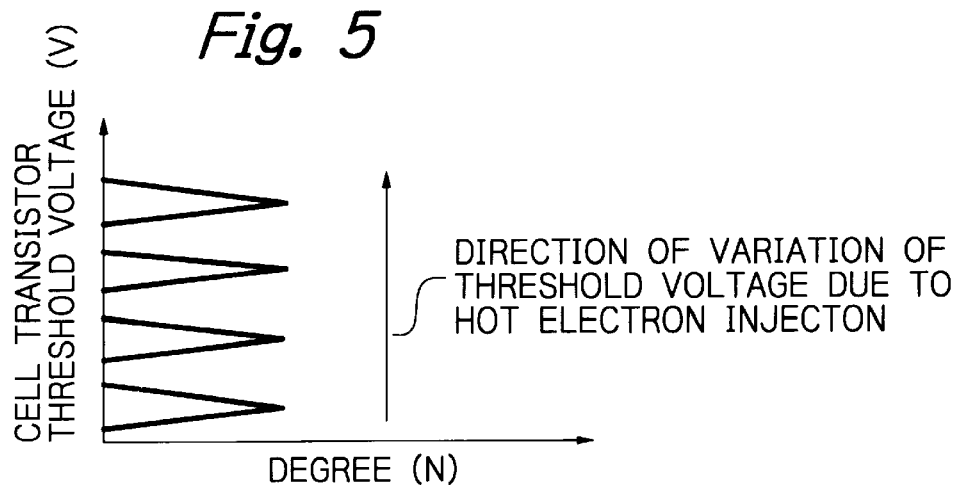
FIG. 5 is a graph showing a threshold value distribution of a cell transistor included in a multivalue nonvolatile semiconductor memory device.

FIG. 5 shows a threshold potential distribution particular to a multivalue nonvolatile semiconductor memory device. Generally, in the case of hot electron injection, the threshold potential of this type of memory device is also raised during writing. A writing operation exceeding a preselected threshold potential would result in erroneous writing. Therefore, it is a common practice to repeat the writing operation and write confirming operation little by little, thereby adjusting the threshold of a cell transistor.

With any one of the conventional electrically writable nonvolatile semiconductor memory devices, it is difficult to minimize the substantial period of time necessary for the writing operation to be completed, and to set a desired threshold with accuracy. Specifically, the writing operation must be followed by the write confirming operation; the writing operation and write confirming operation must be repeated a number of times satisfying the desired accuracy of the threshold (see FIG. 4). This increases the substantial period of time for the writing operation to be completed. Should the number of times of write confirming operation be reduced in order to reduce the substantial writing time, the deviation from the desired threshold would increase to a critical degree.

The above problems are more conspicuous with the multilevel electrically writable semiconductor memory device. In this type of memory device, a writing operation exceeding a preselected threshold potential would result in erroneous writing, as mentioned earlier. It is necessary to repeat a delicate writing operation and a write confirming operation frequently because the threshold potential is changes with a change in the threshold voltage of a cell transistor (see FIG. 3). As a result, the ratio of the period of time necessary for write confirmation to the substantial period of time for writing increases to an excessive degree. This is particularly true when the number of bits to be written to a single cell transistor increases, noticeably degrading the performance of the memory device.

Figure 6:
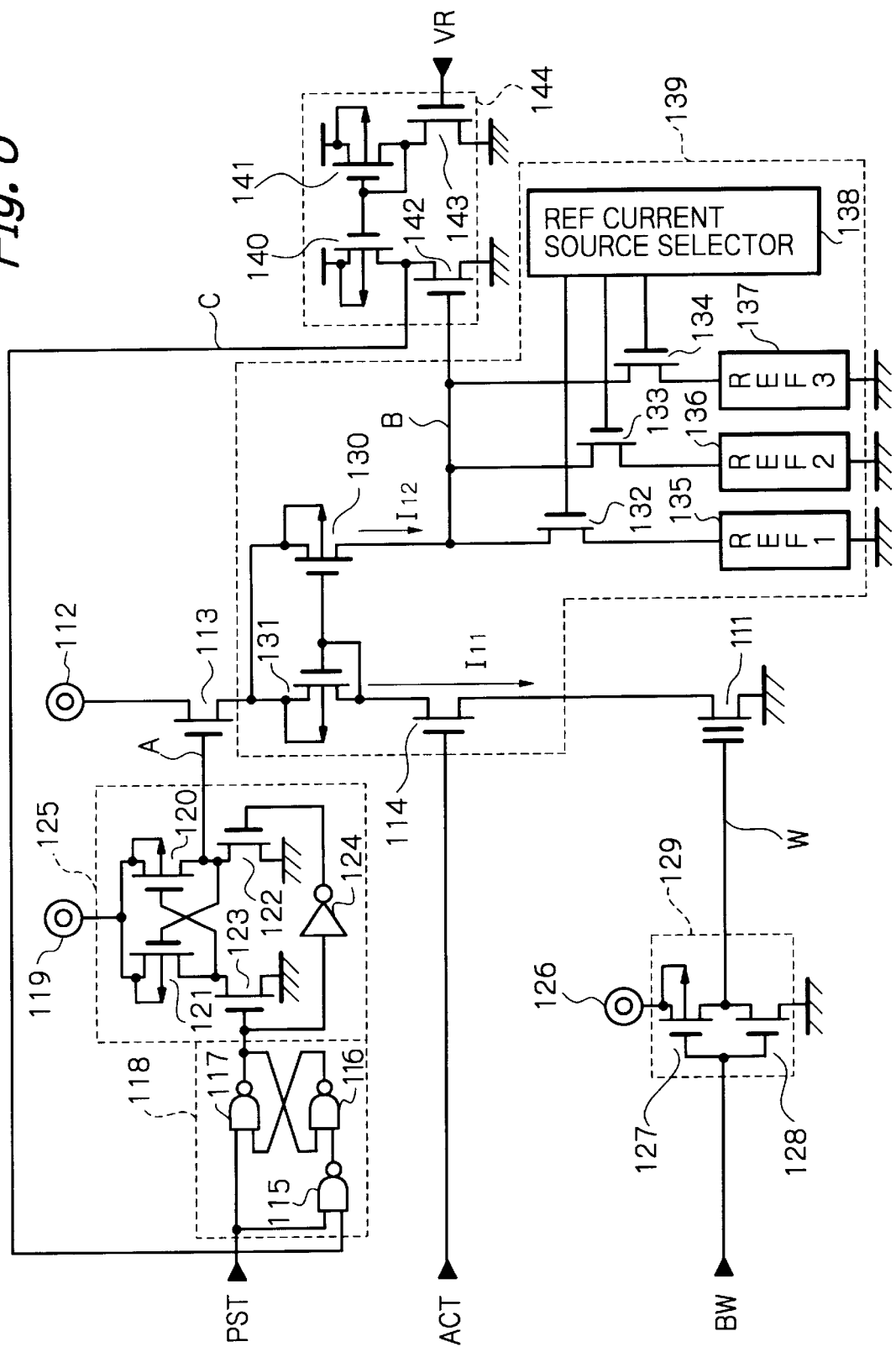
FIG. 6 is a circuit diagram showing a multilevel electrically writable nonvolatile semiconductor memory device embodying the present invention.

Referring to FIG. 6, a multivalue electrically writable nonvolatile semiconductor memory device embodying the present invention is shown and implemented by the hot electron injection scheme. As shown, the memory device includes a memory cell transistor 111. N-channel MOS transistors 113 and 114 are connected between the memory cell transistor 111 and a first power source terminal 112. A latch circuit 118 has NAND gates 115, 116 and 117 connected together, as illustrated. A level shifter 125 is connected to a second power source terminal 119 and made up of p-channel MOS transistors 127 and an n-channel MOS transistors 122 and 123, and an inverter 124. A driver 129 is connected to a third power source terminal 126 and made up of a p-channel MOS transistor 127 and an n-channel MOS transistor 128. A differential amplifier circuit 139 is implemented by p-channel MOS transistors 130 and 131, n-channel MOS transistors 132, 133 and 134, a first, a second and a third reference current source 135, 136 and 137 (REF 1 through REF 3), a reference current source selector 138, and the transistor 114. Another differential amplifier circuit 144 has p-channel MOS transistors 140 and 141 and n-channel MOS transistors 142 and 143.

The latch circuit 118 is reset when a low (L) level preset signal (PST) is input thereto. While the latch circuit 118 is in its reset state, the level shifter 125 shifts the level of a potential applied to the power source terminal 119 and thereby sets at a point A a potential necessary for clamping the drain potential of the cell transistor 111. At this instant, when a high (H) level is input to the transistor 114 as a write control signal ACT, the write potential applied to the power source terminal 112 is fed to the drain of the cell transistor 111.

The latch circuit 118 is set when a write current meant for the cell transistor 111 falls below a preselected value, as will be described specifically later. In this case, the level of the potential at the point A goes L, so that the writing operation is stopped even if the write control signal ACT is in its H level.

To write data in the cell transistor 111, it is necessary for the driver 129 to feed a preselected potential to a word line W in response to a word line select signal BW. That is, if such a potential is applied to the word line W and if the above write potential is applied to the drain of the cell transistor 111, data is written to the cell transistor 111 by hot electron injection.

The differential amplifier circuit 139 senses a change in a current $I_{11}$ flowing through the cell transistor 111, and varies a potential at a point B accordingly. The first to third reference current sources 135–137 each outputs a particular current. The output currents of the reference current sources 135–137 respectively correspond to desired threshold values to be set in the cell transistor. One of the output currents of the reference current sources 135–137 selected by the reference current source selector 138 is compared to the current $I_{11}$ (actually $I_{12}$) that is decreasing due to the writing operation. When the current $I_{11}$ reaches a preselected value, the potential at the point B is caused to go L.

The other differential amplifier circuit 144 amplifies the fine amplitude of the potential at the point B in response to a signal VR. In a word, this circuit 144 fixes a potential at a point C at the H level in response to the change of the point B to the L level. If desired, the circuit 144 may be replaced with, e.g., an inverter so long as it can satisfy the preselected condition.

When the potential at the point C is fixed at the H level by the differential amplifier circuit 144, the latch circuit 118 is set and causes the level shifter 125 to change the level at the point B to L. Consequently, the potential at the power source terminal 112 is not fed to the drain of the cell transistor 111, causing the writing operation to be stopped without regard to the potential of the write control signal ACT.

Figure 7:
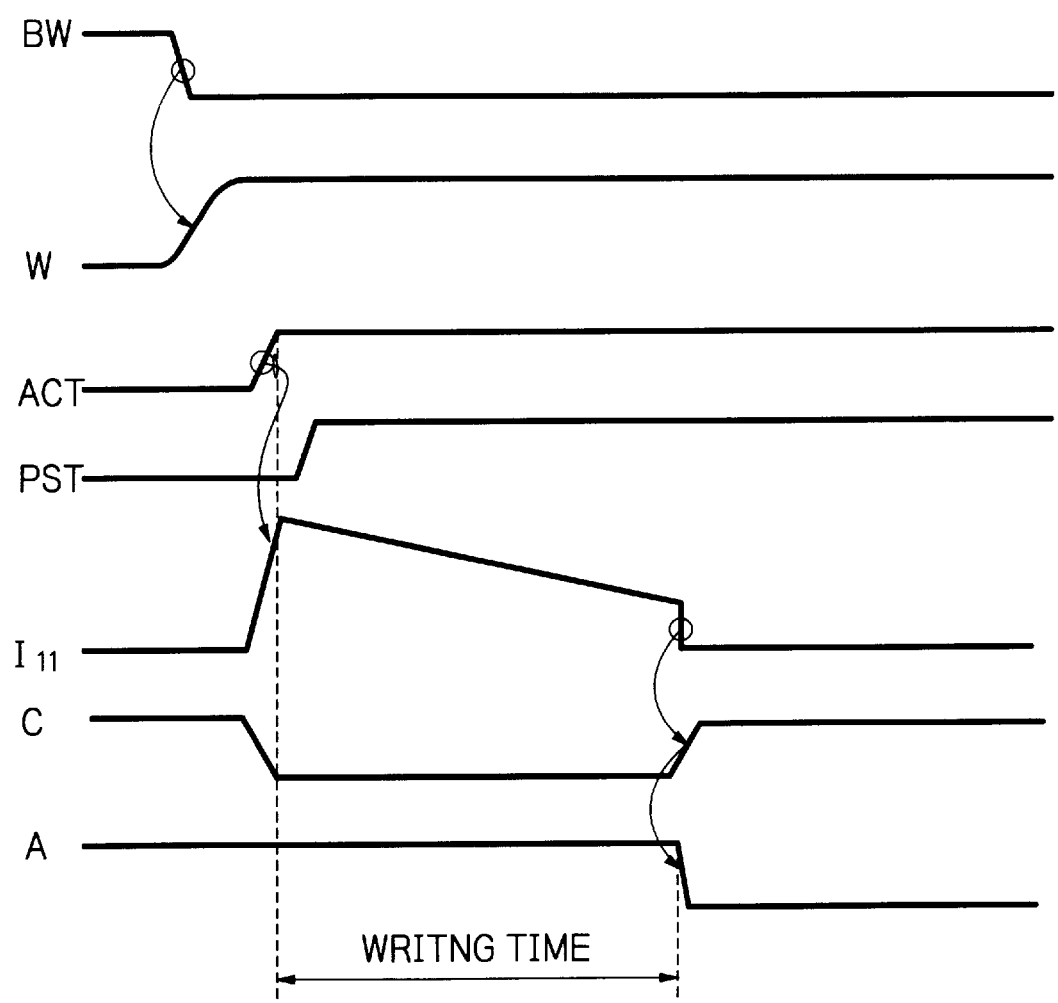
FIG. 7 is a timing chart showing the variation of potentials appearing at various points shown in FIG. 6.

The writing operation of the illustrative embodiment will now be described. Basically, the embodiment controls the writing operation on the basis of the threshold value of the cell transistor which varies due to the writing operation and, in turn, causes the current flowing through the cell transistor to vary. That is, while executing the writing operation, the embodiment measures a current flowing through the cell transistor and determines whether or not to continue the writing operation, depending on whether or not the above current reaches a preselected value. This eliminates the need for the conventional write confirming operation independent of the writing operation and thereby optimizes (reduces) the substantial period of time used from the beginning to the end of the writing operation. FIG. 7 demonstrate how the potentials at the various portions shown in FIG. 6 vary specifically.

First, a desired threshold voltage matching with data to be written is set because the embodiment implements multivalue electrical writing. Specifically, one of the three reference current sources 135–137 is selected and used to determine whether or not to end the writing operation. Before a writing operation begins, the write control signal ACT and preset signal PST each is held in its L level or preset state. In this condition, a write set potential is fed from the power source terminal 119 to the point A via the level shifter 125. Then, the word select signal BW is brought to its L level in order to apply a write potential (e.g. 12 V) to the word line W. This is the preparatory stage in which the memory device is ready to write data in response to a change of the write control data ACT from the L level to the H level.

When the write control signal ACT goes H, a writing operation begins. Specifically, a great amount of write current $I_{11}$ flows through the cell transistor 111, causing the current $I_{12}$ to flow. As a result, the potential at the point B rises and turns on the transistor 142, so that the potential at the point C goes L. At this time, the present signal PST is brought to its H level in order to render the latch circuit 118 active.

The threshold value of the cell transistor 111 sequentially increases as the writing operation proceeds. The rise of the threshold voltage causes the write current $I_{11}$ to fall. Consequently, the potential at the point B falls on the basis of the comparison between the write current $I_{11}$ and the reference current. Therefore, the transistor 142 turns off and causes the potential at point C to go H. As a result, the latch circuit 118 is set and causes the level shifter 125 to change the potential at the point A to the L level. This turns off the transistor 113 and thereby ends the writing operation.

As stated above, an optimal threshold value for the cell transistor 111 can be set only by the writing operation, i.e., without resorting to an exclusive write confirmation sequence. This realizes both the optimal writing time and the accurate setting of a threshold potential.

Figure 8:
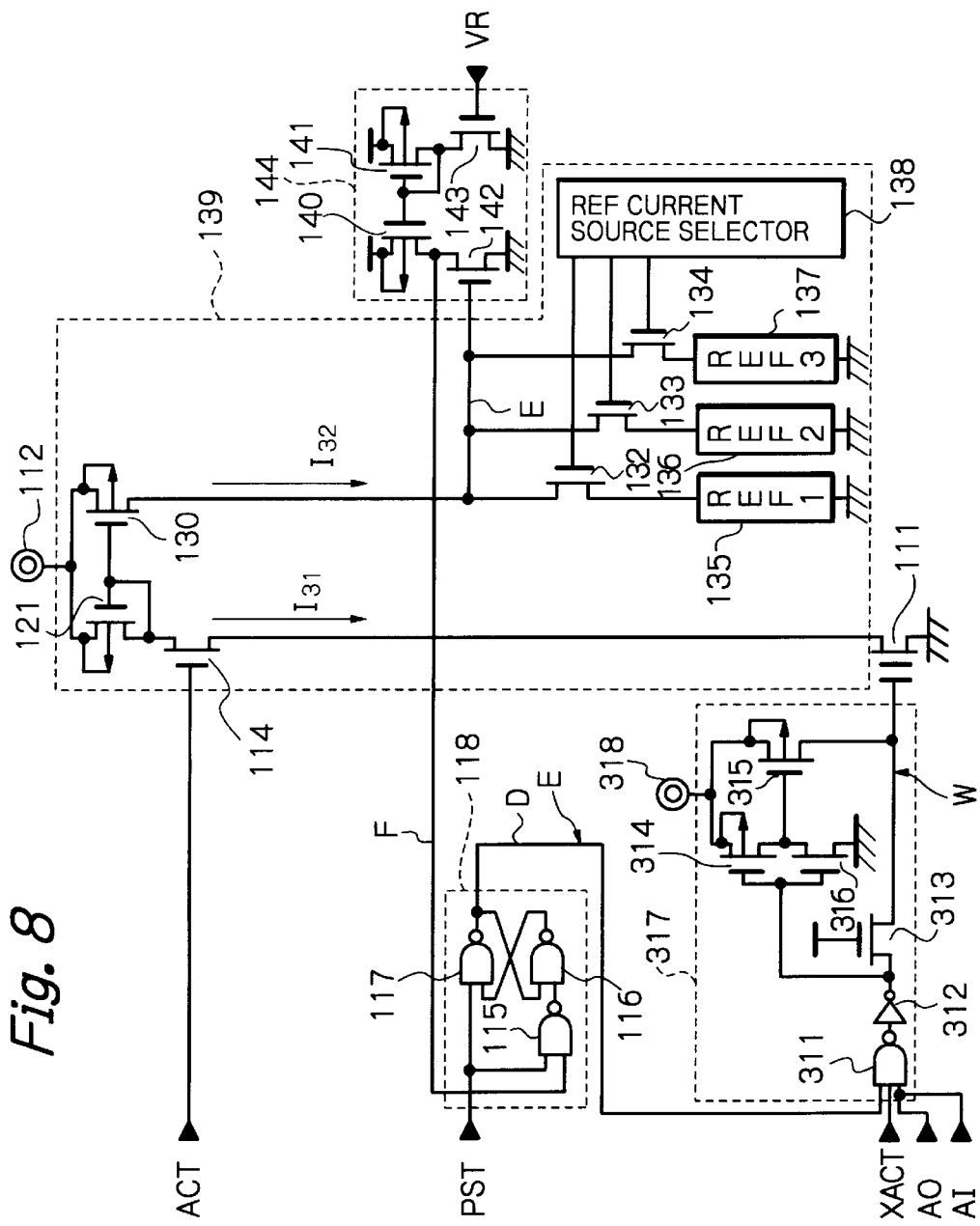
FIG. 8 is a circuit diagram showing an alternative embodiment of the present invention.
Figure 9:
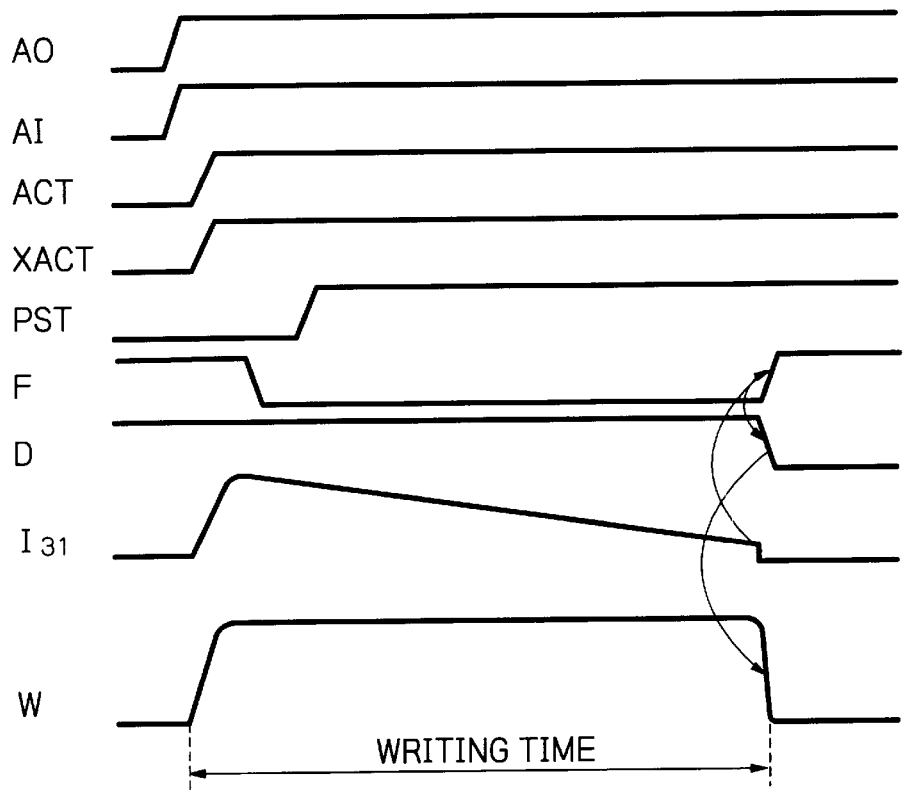
FIG. 9 is a graph showing the variations of potentials appearing at various points shown in FIG. 8.

FIGS. 8 and 9 show an alternative embodiment of the present invention. This embodiment pertains to a multivalue electrically writable nonvolatile semiconductor memory device implemented by the Fowler-Nodeheim tunneling scheme. In FIG. 8, the same structural elements as the elements shown in FIG. 1 are designated by like reference numerals, and a detailed description thereof will not be made in order to avoid redundancy.

As shown in FIG. 8, the latch circuit 118 is reset by the L level preset signal PST, as in the previous embodiment, and fixes a potential at a point D at the H level. The latch circuit 118 is set by the H level signal input from the differential amplifier circuit 142. The transistor 144 turns on in response to the write control signal ACT of H level. As a result, a read potential which would not obstruct writing based on Fowler-Nodeheim tunneling is applied from the power source terminal 112 to the drain of the cell transistor 111.

When the latch circuit 118 is in its reset state, a word decoder 317 applies a write potential from a power source terminal 318 to the word line W in response to a second write control signal XACT and word line select signals (A0 and A1). When the latch circuit 118 is set, the word decoder 317 causes the word line W to go L without regard to the level of the second write control signal XACT.

During writing, the differential amplifier 139 causes the potential at the point E to vary in accordance with a write current $I_{31}$ flowing through the cell transistor 111, as in the previous embodiment. Of course, the variation of the potential at the point E depends on the current values assigned to the reference current sources 135–137 beforehand. Specifically, when the write current $I_{31}$ reaches a preselected value based on the comparison between the current value of the reference current source selected by the selector 138 and the write current $I_{31}$ (current $I_{32}$), a point F is caused to go L.

The differential amplifier circuit 144 causes the potential at the point F to vary in accordance with the potential at the point E. Specifically, when the point E goes L, the circuit 144 fixes the point F at the H level and thereby sets the latch circuit 118. The circuit 144 may, of course, be implemented by an inverter, as in the previous embodiment. When the point F is set at the H level, the latch circuit 118 is set and changes its output to the L level. As a result, the potential on the word line W goes L and stops the writing operation.

Reference will also be made to FIG. 9 for describing the operation of the above embodiment. First, a reference current source matching with a desired threshold voltage is selected on the basis of data to be written, as in the previous embodiment. Before a writing operation begins, the first and second write control signals ACT and XACT and preset signal PST each is brought to the L level or preset state. Subsequently, the word line select signals A0 and A1 are caused to go H, and then the second write control signal XACT is caused to go H. As a result, a write potential (e.g. 18 V) is fed from the power source terminal 318 to the word line W. Further, the first write control signal ACT is caused to go H in order to start a writing operation.

At the initial stage of the writing operation, a great amount of write current I31 flows. Therefore, the points E and F remain at the H level and L level, respectively. Just after this stage, the preset signal PST is caused to go H in order to render the latch circuit 118 active.

As the writing operation proceeds, the threshold voltage of the cell transistor 111 sequentially rises, causing the write current $I_{31}$ to sequentially fall. The potential at the point E, which is the result of comparison between the write current $I_{31}$ and the reference current, falls and turns off the transistor 142. Consequently, the point F goes H and sets the latch circuit 118. On the change of the output of the latch circuit 118 to the L level, the output of the word decoder 317 goes low and stops the writing operation.

Figure 10:
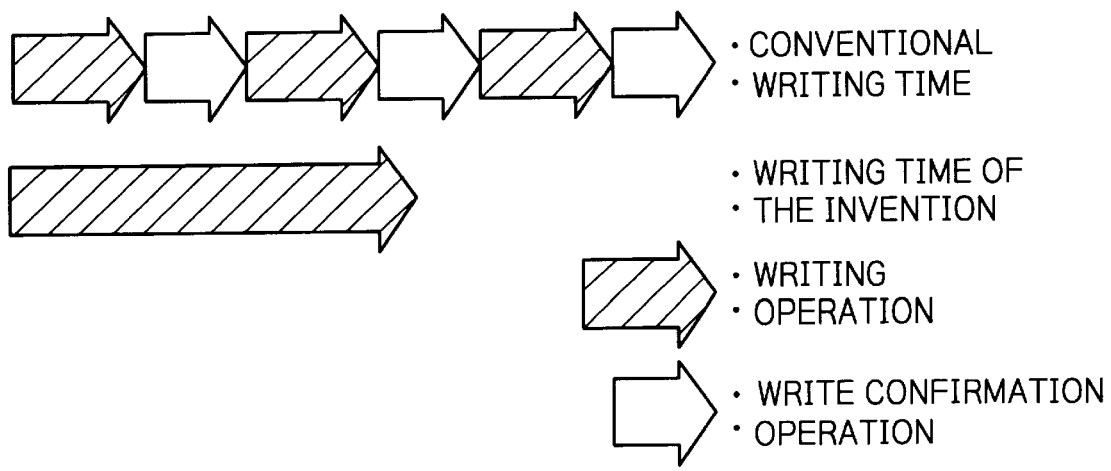
FIG. 10 compares the writing time of the conventional memory device and the writing time achievable with the embodiment shown in FIG. 8.

FIG. 10 shows a difference between the writing time of the conventional memory device and the writing time achievable with the illustrative embodiment.

As stated above, even with the Fowler-Nodeheim tunneling scheme, both the optimal writing time and the accurate setting of a threshold voltage are attainable by effecting only the writing operation, i.e., without resorting to a write confirmation sequence.

In summary, it will be seen that the present invention provides an electrically writable nonvolatile semiconductor memory device eliminating the need for a write confirming operation. This is because the memory device detects a write current flowing through a memory cell transistor during writing and stops writing when the write current reaches a preselected value. Further, a threshold value for the memory cell transistor can be accurately set only if a relation between a threshold voltage and the write current is determined with accuracy beforehand. The memory device therefore realizes both the accurate writing to a desired threshold voltage and the noticeable decrease in writing time, which are particularly desirable with a multivalue semiconductor memory device.

Various modifications will become possible for those skilled in the art after receiving the teachings of the present disclosure without departing from the scope thereof. For example, while the illustrative embodiments have concentrated on a semiconductor memory device using a cell transistor whose threshold voltage rises during writing, the present invention is similarly practicable with a semiconductor memory device using a cell transistor whose memory device can be controlled in the same manner if a write current is detected.

What is claimed is:

1. An electrically writable nonvolatile semiconductor memory device including a memory cell transistor, comprising:

current feeding means for feeding a write current to said memory cell transistor during writing;

write current sensing means for producing a sense signal when said write current reaches a preselected value;

stopping means for stopping a writing operation in response to said sense signal; and wherein at least two threshold values are set in said memory cell transistor.

2. A memory device as recited in claim 1, wherein said write current sensing means further comprises:

reference current generating means for generating a reference current; and differential amplifying means for comparing said write current and said reference current, said write current sensing means producing said sense signal on the basis of a result of comparison between said write current and said reference current.

3. A memory device as recited in claim 2, wherein said reference current output from said reference current generating means is capable of having a desired value.

4. An electrically writable nonvolatile semiconductor memory device including a memory cell transistor, comprising:

current feeding means for feeding a write current to said memory cell transistor during writing;

write current sensing means for producing a sense signal when said write current reaches a preselected value;

stopping means for stopping a writing operation in response to said sense signal;

a plurality of reference current generating means each generating a particular reference current;

selecting means for selecting any one of said plurality of reference current generating means;

differential amplifying means for comparing the reference current output from the reference current generating means selected and said write current; and said write current sensing means outputting said sense signal on the basis of a result of comparison between said current and said reference current.

5. A memory device as recited in claim 4, wherein at least two threshold values are set in said memory cell transistor.

6. A memory device as recited in claim 4, wherein the reference current output from at least one reference current generating means is variable.

7. A memory device as recited in claim 6, wherein at least two threshold values are set in said memory cell transistor.

* * * * *